(12) United States Patent
Geitner et al.

(10) Patent No.: US 11,574,889 B2
(45) Date of Patent: Feb. 7, 2023

(54) POWER MODULE COMPRISING TWO SUBSTRATES AND METHOD OF MANUFACTURING THE SAME

(71) Applicant: Infineon Technologies AG, Neubiberg (DE)

(72) Inventors: Ottmar Geitner, Pentling (DE); Wolfram Hable, Neumarkt (DE); Andreas Grassmann, Regensburg (DE); Frank Winter, Regensburg (DE); Christian Neugirg, Regensburg (DE); Ivan Nikitin, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 895 days.

(21) Appl. No.: 13/909,133

(22) Filed: Jun. 4, 2013

(65) Prior Publication Data

US 2014/0353818 A1    Dec. 4, 2014

(51) Int. Cl.
*H01L 23/48*    (2006.01)
*H01L 23/52*    (2006.01)
(Continued)

(52) U.S. Cl.
CPC .......... *H01L 24/89* (2013.01); *H01L 23/3107* (2013.01); *H01L 23/3735* (2013.01); *H01L 23/49531* (2013.01); *H01L 23/49575* (2013.01); *H01L 24/83* (2013.01); *H01L 24/97* (2013.01); *H01L 25/50* (2013.01); *H01L 23/4334* (2013.01); *H01L 24/29* (2013.01); *H01L 24/32* (2013.01); *H01L 2224/26135* (2013.01); *H01L 2224/291* (2013.01); *H01L 2224/29005* (2013.01); *H01L 2224/29124* (2013.01); *H01L 2224/29147* (2013.01); *H01L 2224/30181* (2013.01); *H01L 2224/83048* (2013.01); *H01L 2224/83139* (2013.01); *H01L 2224/83191* (2013.01); *H01L 2224/83201* (2013.01); *H01L 2224/97* (2013.01); *H01L 2924/1305* (2013.01);
(Continued)

(58) Field of Classification Search
CPC ............... H01L 24/89; H01L 23/49575; H01L 23/49531; H01L 23/3735; H01L 23/3107; H01L 24/83; H01L 24/97; H01L 25/50; H01L 25/0657; H01L 2924/01013; H01L 2224/48091; H01L 2924/01029; H01L 2924/01079; H01L 2924/14
USPC ......... 438/107, 109, 110, 612, 666; 257/734
See application file for complete search history.

(56) References Cited

U.S. PATENT DOCUMENTS

| 6,064,573 A | 5/2000 | Morton |
| 2004/0099944 A1 | 5/2004 | Kimura |

(Continued)

FOREIGN PATENT DOCUMENTS

| EP | 0932201 A2 | 7/1999 |
| JP | 0932201 | * 1/1999 |

(Continued)

*Primary Examiner* — Duy T Nguyen
*Assistant Examiner* — Dilinh P Nguyen

(57) ABSTRACT

A method of manufacturing a power module comprising two substrates is provided, wherein the method comprises disposing a compensation layer of a first thickness above a first substrate; disposing a second substrate above the compensation layer; and reducing the thickness of the compensation layer from the first thickness to a second thickness after the second substrate is disposed on the compensation layer.

12 Claims, 3 Drawing Sheets

(51) Int. Cl.
*H01L 23/00* (2006.01)
*H01L 23/495* (2006.01)
*H01L 23/373* (2006.01)
*H01L 23/31* (2006.01)
*H01L 25/00* (2006.01)
*H01L 23/433* (2006.01)

(52) U.S. Cl.
CPC .............. *H01L 2924/1306* (2013.01); *H01L 2924/13055* (2013.01); *H01L 2924/15787* (2013.01); *H01L 2924/181* (2013.01)

(56) References Cited

U.S. PATENT DOCUMENTS

| | | | |
|---|---|---|---|
| 2005/0205970 A1* | 9/2005 | Chen | H01L 23/49861 257/666 |
| 2006/0060988 A1 | 3/2006 | Edwards | |
| 2007/0266558 A1* | 11/2007 | Otremba | H01L 23/492 29/840 |
| 2011/0089577 A1* | 4/2011 | Eom | H01L 25/50 257/778 |
| 2012/0313207 A1* | 12/2012 | Oganesian | H01L 23/147 257/433 |
| 2013/0010429 A1* | 1/2013 | Tonomura | H01L 23/3735 361/720 |
| 2013/0286618 A1* | 10/2013 | Shibasaki | H01L 23/049 361/772 |
| 2014/0034993 A1* | 2/2014 | Shimokawa | H01L 23/367 257/99 |
| 2014/0268554 A1* | 9/2014 | Dunwoody | G06F 1/20 361/679.54 |

FOREIGN PATENT DOCUMENTS

| | | |
|---|---|---|
| JP | 2000349100 A | 12/2000 |
| WO | 02078088 A1 | 10/2002 |

* cited by examiner

POWER MODULE COMPRISING TWO SUBSTRATES AND METHOD OF MANUFACTURING THE SAME

BACKGROUND OF THE INVENTION

Field of the Invention

The present invention relates to power modules comprising two substrates and methods of manufacturing such modules.

Description of the Related Art

Conventional power modules comprising two substrates opposing each other are well known. In such modules the opposing two substrates often form the outer layers of the module. In order to enable a proper handling, processing and mounting in a larger module or device the dimensions, in particular the thickness, of the modules shall be as well defined as possible, i.e. a tolerance for the total thickness of the module shall be limited to a given threshold. However, typical substrates used in power modules often have, due to the manufacturing process of the substrates, a rather high variation in thicknesses, which variation of the substrates' thicknesses leads to a rather high variation of the total thickness of the completed modules.

Thus, there is still potentially room to improve the manufacturing of modules comprising two substrates.

SUMMARY OF THE INVENTION

There may be a need to provide power modules comprising two substrates wherein the modules have low variations in their outer dimensions.

According to an exemplary aspect a method of manufacturing a power module, in particular a power module, comprising two substrates is provided, wherein the method comprises disposing a compensation layer of a first thickness above a first substrate; disposing a second substrate above the compensation layer; and reducing the thickness of the compensation layer from the first thickness to a second thickness after the second substrate is disposed on the compensation layer.

According to another exemplary aspect a method of manufacturing a power module is provided, wherein the method comprises arranging a first substrate on a bottom plate; disposing a compensation layer of a first thickness above the first substrate; disposing a second substrate above the compensation layer; and reducing the first thickness to a second thickness by an abrasive-free process.

According to another exemplary aspect a power module of a predefined thickness is provided, wherein the power module comprises a first substrate comprising at least one electronic circuit; a second substrate; and a compensation layer of a thickness which is reducible from a first thickness to a second thickness by pressure.

The use of a compensation layer arranged between the two substrates may enable that thickness differences of the used substrates may be compensated for when arranging the two substrates in a stacked manner onto each other. In particular, tolerances or variations in the thickness of layers or elements of the module may be compensated for so that accuracy is improved, and/or a manufacturing yield may be increased. The use of a compensation layer may be advantageous, since additional processes or process steps may be omitted or avoided. Such additional processes or process steps in common manufacturing may relate to polishing or grinding used to reduce the thickness of a connecting layer or spacer connecting or contacting the two substrates of a module with each other. In particular, the compensation layer may function as a contacting or connecting layer as well. In particular, performing the thickness reduction after the second substrate is already arranged or disposed on the compensation layer may allow that thickness tolerances of the second substrate may be effectively compensated for by the compensation layer as well, which would be more difficult in case the compensation layer is polished or grinded to a specific thickness before the second substrate is arranged on the compensation layer.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings.

DESCRIPTION OF FURTHER EXEMPLARY EMBODIMENTS

Figure 1:
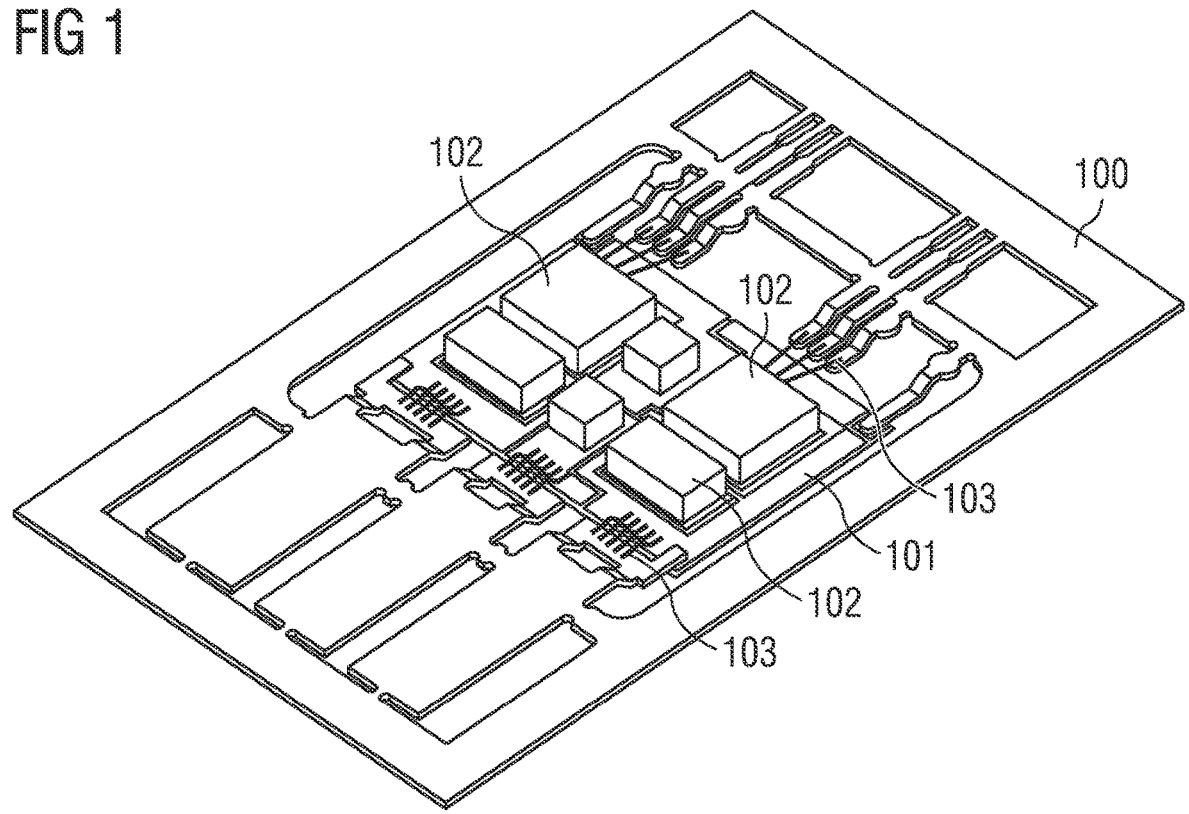
FIG. 1 schematically shows a three-dimensional view of a bottom substrate of a power module comprising electronic chips and thermal and electrical connections according to an exemplary embodiment.

In the following, further exemplary embodiments of the methods and of modules will be explained. It should be noted that embodiments described in the context of a method may also be combined with embodiments of the modules and vice versa.

For example, the compensation layer may be a thickness compensation layer or in other words a layer adapted to compensate for thickness variations of layers or substrates arranged above or below the compensation layer. In particular, the first substrate may be a bottom substrate and/or the second substrate may be a top substrate. The thickness of the compensation layer or compensation structure may particularly be measured perpendicular with respect to main surfaces of the substrates and/or of the module. In particular, the reduction of the thickness of the compensation layer from the first thickness to a second thickness may be performed without grinding and/or without polishing and/or without abrasive processes. In particular, it should be noted that more than two substrates may be used in one module. In or on the first substrate chips or ICs may be formed or arranged.

In particular, the compensation layer may be adapted that the thickness can be reduced from the first thickness to the second thickness by pressure and/or temperature but without grinding and/or polishing and/or an abrasive process. Thus, the reduction of the thickness of the compensation layer may be performed grinding-free and/or polishing-free and/or abrasive-free. In particular, the first substrate may have a first thickness tolerance and the second substrate may have a second thickness tolerance, wherein the reduction of the thickness of the compensation layer may compensate for the tolerances of the thicknesses of the first and second substrates.

In particular, the first substrate, the compensation layer and the second substrate may be stacked onto each other, i.e. form a vertical structure.

The term "substrate" may particular denote a plate like material, structure or stack of layers being suitable to arrange integrated circuits in and/or on the substrate. A substrate may form a laminate comprising one or several layers. The substrate may be a semiconductor substrate (such as a silicon wafer or chip) having at least one monolithically integrated circuit component (such as a transistor, a diode).

The term "compensation layer" may particularly denote any (layered) structure which is adapted or suitable to at least partially compensate for a thickness variation of other layers or components used in the module. In particular, the compensation layer may have a thickness which may be adapted or suitable to be altered, for instance by at least 10%, after the compensation layer is deposited or disposed on the first substrate.

It should be noted that the term "above" does not necessarily mean that one element is directly arranged or disposed on another element, but also comprises that additional layers or elements are disposed between the two elements. For example, the meaning of the feature "disposing a compensation layer of a first thickness above a first or second substrate", includes that the compensation layer is disposed directly on the first substrate and also includes that additional layer(s) are arranged between the first substrate and the compensation layer.

In particular, the module may be a power module. The term "power module" may particularly denote a physical structure comprising a containment accommodating several power components, e.g. power semiconductor devices, which may be housed or packaged by the containment (such as a mold structure). Such a module may provide an easy way to cool the power components and to electrically connect them to an outer circuit, e.g. by electrically and/or thermally conductive contact areas on top and/or the bottom of the module. Examples of power components for or structures or units available as power modules may be switches (metal-oxide-semiconductor-field-effect-transistors or insulated-gate bipolar transistors), half-bridges (inverter leg, with two switches and their corresponding diodes) and three-phase inverters.

The term "abrasive-free process" may particularly denote a process which does not abrase material, e.g. by grinding or polishing. However, displacing and/or squeezing out of material during a process may fall under the definition of "abrasive-free process".

The term "foam" or "foamlike" may particularly denote a material comprising a plurality of voids or holes which may be material free and may enable that the material is compressible. The use of a compressive material may particularly allow that the first thickness of the compensation layer can be reduced to a lower second thickness.

According to another exemplary aspect a power module is provided comprising a first substrate comprising an electronic circuit; a second substrate; and a thickness compensation layer comprising foam material between the first substrate and the second substrate.

According to an exemplary embodiment of the method, the reducing of the thickness of the compensation layer is performed by pressing a lid structure onto the second substrate.

The use of pressure applied to the second substrate or compensation layer via a lid structure may be a suitable process to reduce the thickness of the compensation layer in an abrasive-free manner.

According to another exemplary embodiment of the method, at least one of the group consisting of the first substrate and the second substrate comprises a ceramic layer.

For example, the ceramic layer may comprise $Al_2O_3$ or a similar ceramic material. Ceramic material may be a suitable material for substrates, e.g. of a power module, because it may be properly thermally conductive and can hence significantly contribute to heat dissipation during operation of the power module.

According to an exemplary embodiment of the method, the first substrate and/or the second substrate comprises a conductive cover layer.

In particular, the first substrate and/or the second substrate may comprise an electrical conductive layer and/or a thermally conductive layer, for example a metal layer, e.g. a copper layer. For example, the metal layer may form an overlay or plating of the first substrate and/or the second substrate. In particular, both major surfaces of the first substrate and/or the second substrate may be overlaid or plated by a metal layer.

Any of the bonding substrates may be a three-sheet substrate with a central ceramic plate (for instance made of aluminium oxide or aluminium nitride or silicon nitride) as the electric insulator and thermal conductor sheet. As an alternative to a ceramic material, the electric insulator and thermal conductor sheet may also be made of a thermally conductive plastic material (which may comprise epoxide, silicone, etc.) and which may be optionally filled by a thermally conductive filler medium (such as aluminium oxide, boron nitride, silicon nitride, aluminium nitride, etc.). The metal sheets of any of the bonding substrates may be made of copper, aluminium, or copper covered with a surface layer of aluminium. Instead of metal sheets, it is possible to use any other electrically conductive and thermally conductive material.

In an embodiment, at least one of the first bonding substrate and the second bonding substrate comprises one of the group consisting of a Direct Copper Bonding (DCB) substrate, and a Direct Aluminium Bonding (DAB) substrate. Particularly, a DCB substrate may be used which comprises a ceramic (or other material) layer directly between a copper layer and another copper layer. A DCB substrate provides a proper basis for mounting of a semiconductor chip on one copper side and for efficient removal of heat via the other copper side. Also by the use of a DAB substrate this goal may be achieved. DCB and DAB substrates are commercially available and therefore allow for a cost efficient solution of the mounting and cooling issues.

The provision of a conductive cover layer in form a continuous layer or at least a partly continuous outer layer of the substrates and/or of the module may enable an efficient way for electrically contacting the module and/or for cooling the module.

According to another exemplary embodiment, the method further comprises mounting the first substrate on a bottom plate.

In particular, the bottom plate may be a carrier, a printed circuit board, a lead frame or a workholding structure and may form a base or outer surface of the module. The use of a bottom plate may be a suitable way to provide a predefined outer surface of the module or at least a predefined base for assembling the module on the same. Such a bottom plate may in particular have a planar or planarized surface onto which the first substrate may be arranged or disposed.

According to another exemplary embodiment, the method further comprises arranging a height setting spacer on the bottom plate.

In particular, the height setting spacer may be arranged on the bottom plate before the first thickness is reduced. Thus, the height setting spacer may be usable as a stop when reducing the first thickness to the second thickness by pressing the lid or cover onto the second substrate, i.e. such a height setting spacer or distance piece may be a suitable element to ensure a predefined thickness of the total module. For example, the height setting spacer may be arranged before the second substrate is disposed on the compensation layer.

According to another exemplary embodiment of the method, the compensation layer comprises a conductive material.

In particular, the material may be an electrically conductive material and/or a thermally conductive material. For example, the specific electric conductivity of the conductive material may be above a given threshold value, in particular it may be above $1 \cdot 10^5$ S/m or even above $1 \cdot 10^6$ S/m. The specific thermal conductivity may be above a predetermined thermal threshold value, in particular it may be above 3 W/(m·K) or even above 100 W/(m·K). In particular, the compensation layer may be formed by a conductive material. The provision of a conductive material in or as the compensation layer may be a suitable measure to ensure a thermal and/or electrical connecting between the first and the second substrates of the module. Examples for the material may be aluminium, copper, in particular annealed copper.

According to another exemplary embodiment of the method, the compensation layer is formed by a material which has a melting point below a given threshold value.

In particular, the given threshold may be defined by the maximum temperature which elements, e.g. IC chips arranged on or in the first and/or second substrates, can withstand without being destroyed. Examples for the given threshold may be 300° C. or even less, e.g. 221° C. In particular, the temperature of the compensation layer or of the module may be increased to a temperature value which is however below the given threshold when reducing the first thickness of the compensation layer, e.g. by pressing a lid structure onto the second substrate. In this case it may be easily possible to reduce the thickness of the compensation layer when pressing the lid structure onto the substrate since some material of the compensation layer may be displaced or squeezed out.

According to another exemplary embodiment of the method, the material is solder.

In particular, the solder may be a solder paste or any other suitable solder material, e.g. solder preform, which can be used to electrically and/or thermally contact or connect the first and second substrate with each other. The provision of solder material as the material used in the compensation layer may ensure that a relatively low melting temperature of the compensation layer can be achieved so that chips or ICs of the module are not destroyed by the increased temperature.

According to another exemplary embodiment of the method, the compensation layer is formed by a compressible material.

In particular, the compressible material may be a conductive material, for example the compressible material may be an electrically and/or thermally conductive material.

According to another exemplary embodiment of the method, the compressible material is a foam material.

The use of a compressible material may particular allow that the first thickness of the compensation layer can be reduced to a lower second thickness. For example, the compressible material may be compressible by a factor of at least two, in particular the factor may be about three, four or even five. In particular, the compensation layer may be adapted so that the thickness of the layer may be reducible by 70% to 80% by a compression force of about 1 MPa to 50 MPa, e.g. at about 40 MPa.

According to another exemplary embodiment of the method, the foam material is a conductive foam material.

In particular, the conductive foam material may be formed by copper, aluminium or another suitable conductive material, for example a material which is electrically conductive and/or thermally conductive and which can be treated so as to assume a foam state.

According to another exemplary embodiment, the method further comprises encapsulating the module.

In particular, the module may be encapsulated by a non-conductive mold material, for example a non-conductive resin material.

According to an exemplary embodiment, the power module further comprises a bottom plate and a lid, wherein the first substrate is arranged or disposed on the bottom plate and the lid is arranged on the second substrate.

According to another exemplary embodiment, the power module further comprises a height setting spacer which is arranged on the bottom plate.

In particular, the height setting spacer may define a total thickness of the module by defining the distance between the first substrate and the second substrate. For example, the height setting spacer may be used in the manufacturing process as a stop.

According to another exemplary embodiment of the power module the compensation layer comprising foam material between the first substrate and the second substrate.

The use of a foam material, e.g. a compressible material may be an efficient way to allow a reduction of the thickness of the compensation layer after the second substrate was arranged above the compensation layer.

According to another exemplary embodiment of the power module, the foam material comprises a conductive material.

In particular, the conductive material may be an electrically and/or thermally conductive material, e.g. copper, annealed copper or aluminium.

Summarizing a gist of an exemplary embodiment may be seen in providing a compensation layer in a power module wherein the compensation layer is adapted to compensate for thickness differences of two or more substrates used in the power module. In particular, it should be mentioned that his compensation may be performed after two substrates are already stacked onto each other so that a conventional compensation by an abrasive process applied to the compensation layer arranged or disposed between the two substrates is not easily possible, since the compensation layer is covered by the two substrates.

DETAILED DESCRIPTION OF THE FIGURES

The above and other objects, features and advantages of the present invention will become apparent from the following description and the appended claims, taken in conjunction with the accompanying drawings, in which like parts or elements are denoted by like reference numbers.

The illustration in the drawing is schematically and not to scale.

FIG. 1 schematically shows a leadframe 100 and attached bottom substrate 101 of a module according to an exemplary embodiment, wherein the bottom substrate 101 includes electronic semiconductor chips 102 and thermal and electrical connections 103. In particular, FIG. 1 shows the leadframe 100 onto which the bottom substrate 101 or first substrate is attached comprising the chips 102 and respective electrical and thermal connection 103 which may be formed at the sides of the bottom substrate 101 and/or chips 102 and/or at the bottom or top, i.e. the main surfaces, of the substrate 101 and/or chips 102. For example, the chips 102 may form so-called half-bridges comprising two IGBTs and two diodes, switches, or inverters. The bottom substrate 101 may be a direct copper bonding (DCB) substrate having a ceramic body, e.g. $AlO_2$, and copper layers or covers arranged or disposed on the ceramic body. A suitable thickness of the leadframe 100 may be in the range of 200 micrometer to 1500 micrometer. Typical thicknesses of the bottom substrate 101 may be in the range of 600 micrometer to 2,200 micrometer in particular, in the range of 820 micrometer to 1040 micrometer, e.g. about 980 micrometer. It should be noted that the used ceramic substrates may have a relatively high thickness tolerance or variance so that without a thickness compensation it may be difficult to use the same in a device or module adapted to be contacted on both major surfaces of the module. However, when using a compensation layer, as described below, in order to compensate for these differences, optionally together with a mounting device, like leadframe 100, it may be possible to ensure that the ready module has a low thickness variation.

With respect to all embodiments shown in the FIGS. 1 to 7 it should be noted that when using the term "substrate" this term may also encompass chips or ICs formed in or on the respective substrate.

Figure 2:
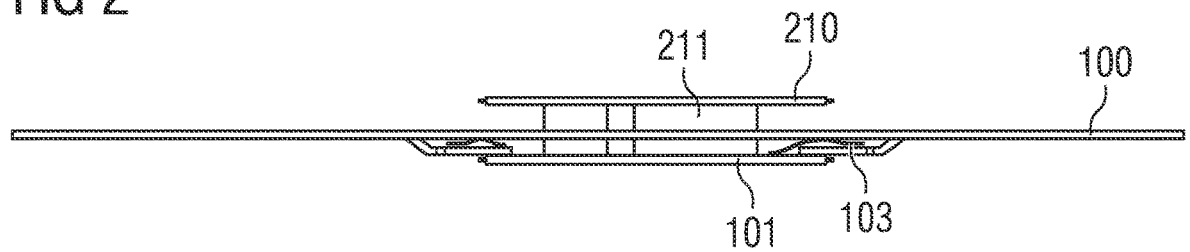
FIG. 2 schematically shows a cross-sectional view of a module comprising bottom substrate and top substrate and according to an exemplary embodiment.

FIG. 2 schematically shows a module prior to molding, comprising bottom substrate 101 of FIG. 1 and a top substrate 210, according to an exemplary embodiment. In particular, FIG. 2 shows the leadframe 100 and the bottom substrate 101 of FIG. 1 in a side view. Additionally, the top substrate or second substrate 210 is shown. The bottom and top substrates 101, 210 are attached to each other by a compensation layer 211 arranged or disposed between the two substrates 101, 210 or between the chips 102 or ICs arranged on or in the substrates 101, 210. Furthermore, some electrical connections 103 are shown in FIG. 2. The total thickness of the module may be in the range of 2 millimeter to 10 millimeter, e.g. about 4.7 mm.

Figure 3:
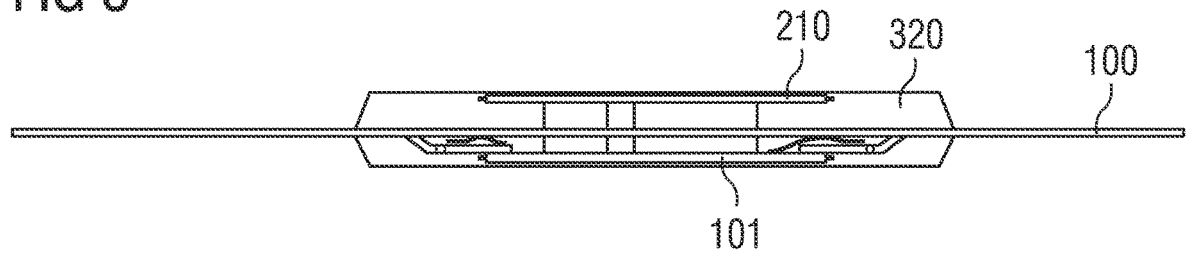
FIG. 3 schematically shows the module of FIG. 2 having a molded encapsulation.

FIG. 3 schematically shows the module of FIG. 2 having a molded encapsulation. In particular, FIG. 3 shows the module of FIG. 2 comprising the leadframe 100, the bottom substrate 101 and the top substrate 210 encapsulated by a molding compound 320. The molding compound 320 may be formed by a resin or any other suitable material which can be used for passivation of the module. The total thickness of the encapsulated module may be in the range of 2 to 10 millimeter.

Figure 4:
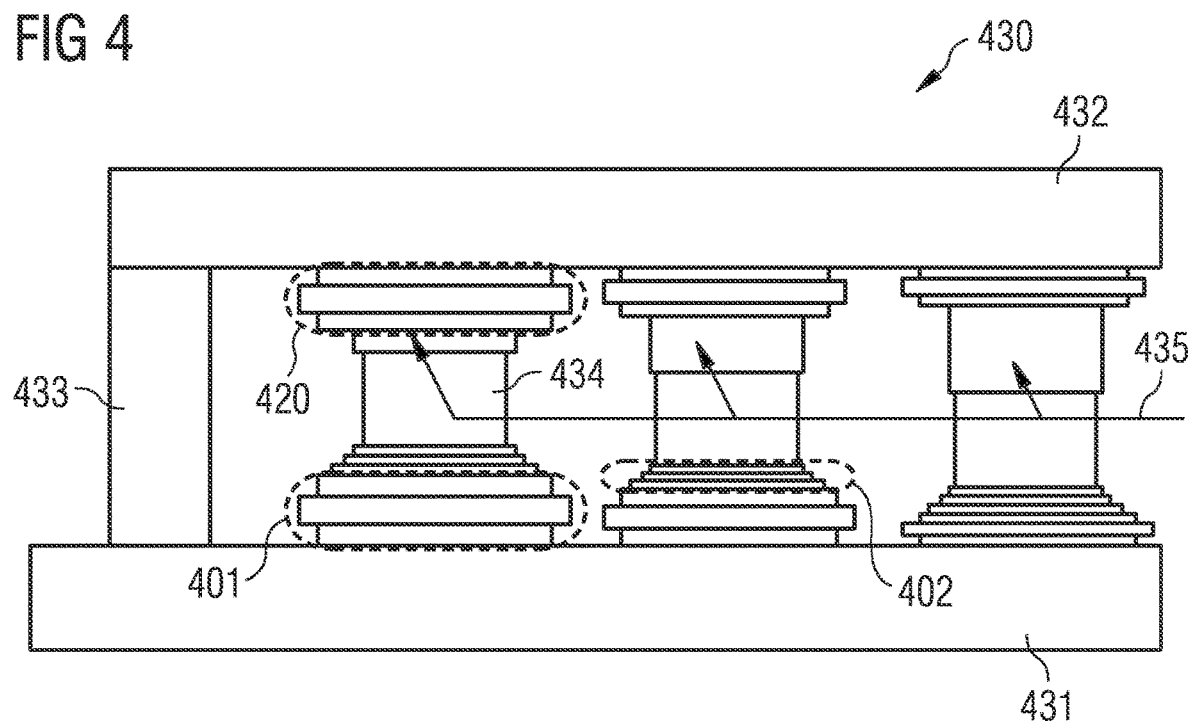
FIG. 4 schematically shows a cross-sectional view of a module according to an exemplary embodiment.

FIG. 4 schematically shows details of a module according to an exemplary embodiment. In particular, FIG. 4 shows a portion of a module 430 during the manufacturing of the module and arranged or disposed in a mounting structure comprising a bottom workholding structure 431 and a lid structure 432, wherein the lid structure 432 may be float-ingly arranged. Arranged on the bottom workholding structure 431 is a height setting spacer 433 which can be used as a stop during the manufacturing or assembling process of the module. Additionally three first substrates 401 are shown all having a different thickness due to the thickness tolerances of the first substrates 401, e.g. ceramic substrates. Additionally, three second substrates 420 are shown in FIG. 4 as well, also having different thicknesses. For example, the thicknesses of the first and second substrates 401, 424 decrease from the left to the right in FIG. 4 for illustrative purposes.

The first substrates or bottom substrates 401 may be mounted to a leadframe (not shown) and/or may be placed to the workholding structure 431 during the manufacturing process and comprises chips or ICs 402. Atop of the bottom substrates 401 or the chips 402 a connecting layer or block 434 is arranged followed by a compensation layer or thickness compensation layer 435. Although only one compensation layer 435 is shown between one bottom substrate 401 and the respective top substrate 420, a plurality of compensation layers 435 may be used as well. The thickness of the connecting layer or spacer 434, formed by an electrically conductive and/or thermal conductive material may be in the range of 0.5 millimeter to 8 millimeter, e.g. 2.5 mm. The thickness of the compensation layer 435 is adapted to ensure that the maximum thickness tolerances of the bottom and top substrates 401, 420 can be compensated for. For example, the total thickness of the compensation layer 435 may be in the range of 30 micrometer to 400 micrometer, e.g. about 300 pm. In particular, the compensation layer 435 may be formed by solder material which forms an electrically conductive and thermal conductive connection between the bottom substrate 401 and the top substrate 420 as well.

It should be noted that the top substrates 420 may be attached to the connecting layer 434 or compensation layer 435 or may be attached to the lid 432 before placing the lid 432 on top.

Furthermore, it should be mentioned that the height setting spacer may have a length or thickness which corresponds to the intended thickness of the module when measuring the same from the bottom of a first substrate 401 to the top of the second substrate 420, for example which may correspond to the total thickness of the power module without a (molded) encapsulation.

Figure 5:
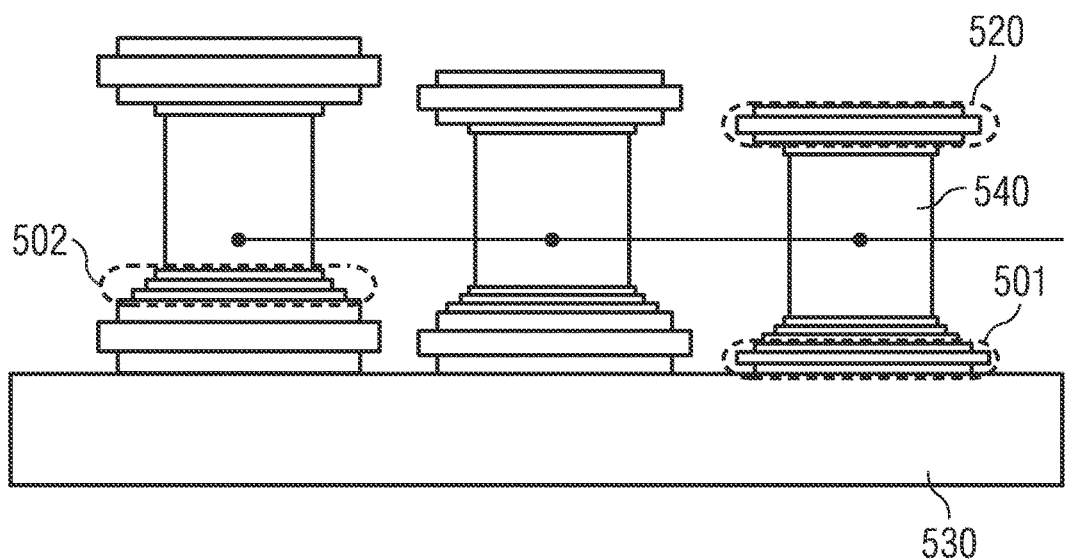
FIGS. 5 to 7 schematically shows cross-sectional views of structures obtained during carrying out a method of manufacturing a module according to another exemplary embodiment.
Figure 6:
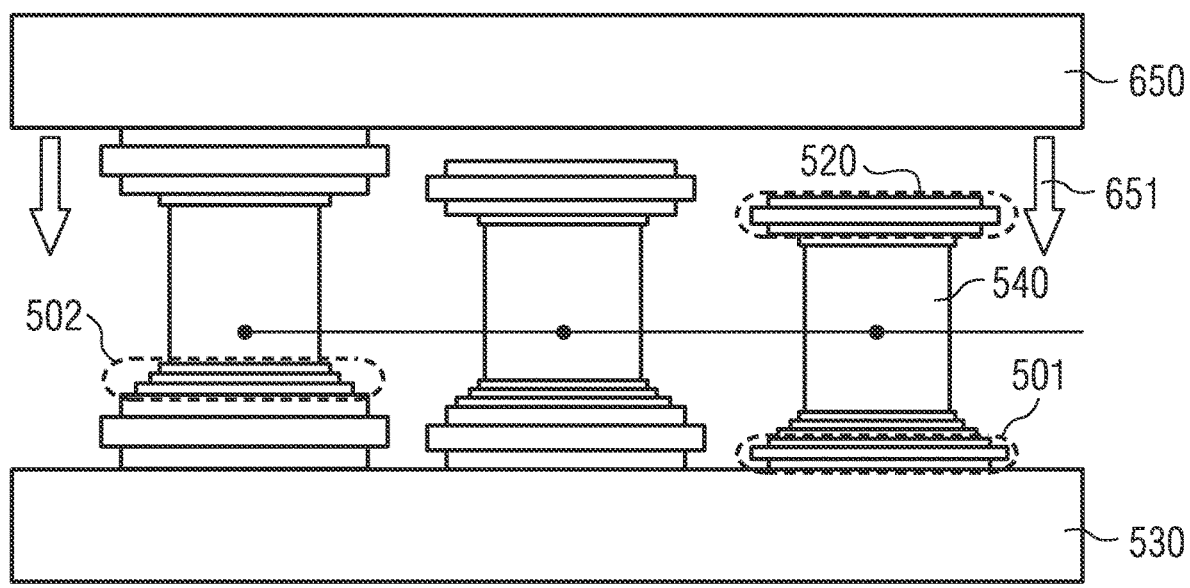
Figure 7:
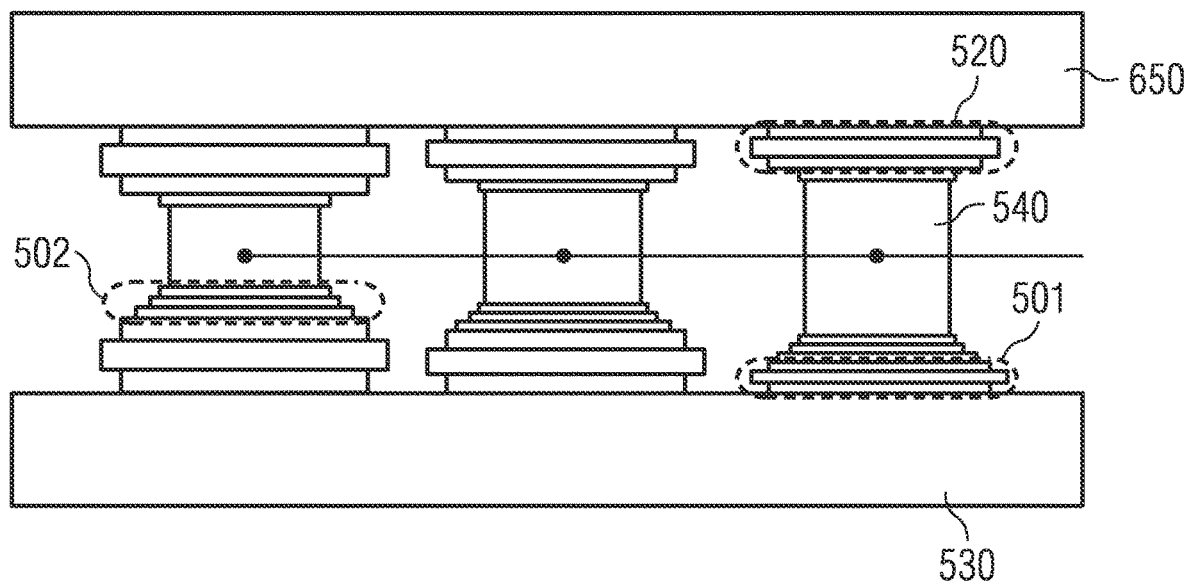

FIGS. 5 to 7 schematically shows structures obtained during carrying out a process of manufacturing a module according to another exemplary embodiment. FIGS. 5 to 7 show the process when using a compensation layer 540 comprising or formed by a compressible, e.g. foamlike, material.

In particular, FIG. 5 shows a bottom workholding structure 530 on which three first or bottom substrates 501 are arranged or placed, each having different thicknesses due to manufacturing tolerances and each comprising chips or ICs 502. On top of each of the first substrates 501 a respective compressible compensation layer 540 is arranged or placed. In particular, the compressible compensation layer 540 may comprise or may consist of a foam material. Suitable foam materials may be made by converting aluminum or copper in a foam phase. Such compressible compensation layers 540 may enable a reduction of size by a factor of 3 to 6 when applying a force or pressure of about 1 MPa to 50 MPa, e.g. 40 MPa. On top of each of the compensation layers 540 a top or second substrate 520 is arranged or placed. Also these second substrates 520 may have different thicknesses due to manufacturing tolerances. In FIG. 5 the thicknesses of the substrates 501, 520 decrease from the left to the right for illustrative purposes.

FIG. 6 schematically depicts a next manufacturing procedure of a module. In particular, FIG. 6 shows the placing of a lid structure 650 onto the second substrates 520. The placing is schematically indicated by the arrows 651. The placing of the lid 650 may be performed together or independently of a molding process for encapsulating the module. By providing a pressure force to the compressible compensation layer 540 the thickness of the same is reduced from a first thickness to a second thickness thereby compensating for thickness tolerances of the first and/or second substrates 501, 520, which may be ceramic substrates also in this embodiment. For defining the total thickness height setting spacers (not shown) may be used which are arranged on the bottom workholding structure 530 and which are used as stops for the compression process. It should be noted that the total thickness or height of the structure shown in FIG. 6 is always above the final module or package thickness.

FIG. 7 schematically shows the structure of FIG. 6 after the compression step is finished, i.e. shows the compressible compensation layer 540 in a final state. In this state the thickness differences of the first substrates 501 and/or second substrates 520 are compensated for.

Summarizing, according to a gist of an exemplary embodiment, a method of manufacturing or producing a power module may be provided, wherein the module has substrates on at the sides of both major surfaces, e.g. on the bottom and on the top of the module. By providing a (thickness) compensation layer between the bottom substrate and the top substrate tolerances of the substrate thicknesses may be compensated for in an easy and efficient manner.

In particular, it should be mentioned that the compensation may be performed in a non-abrasive way, i.e. without performing polishing or grinding. The bottom and top substrate(s) may be ceramic substrates having a relatively high tolerance or variance of the thickness and which are covered on top and/or bottom by a metallic or conductive layer. The tolerance may be in the range of +7% and −10% which leads to a variation of about +69 micrometer and −167 micrometer in the case of a substrate having a typical thickness of about 980 micrometer.

An example of such substrates is the so called direct copper bonding substrate. The conductive, e.g. copper layer may be used for connecting the substrate and/or chips arranged in or on the substrate, preferably in the bottom substrate, to the outside or another device or module. Additionally the conductive layer may be used to convey or dissipate heat of the substrates and/or the respective chips of the substrates. By providing the respective compensation layer, the above described thickness variations of the substrates may be compensated for so that these variations are not relayed to the total thickness of the ready module in which the substrates are implemented.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of manufacturing a power module comprising two substrates, the method comprising:
   disposing a connecting layer atop of a first substrate;
   disposing a compensation layer of a first thickness above the connecting layer;
   disposing a second substrate above the compensation layer; and
   reducing the thickness of the compensation layer from the first thickness to a second thickness after the second substrate is disposed on the compensation layer; wherein
   the second thickness of the compensation layer is smaller than a thickness of the connecting layer,
   during manufacturing the power module is arranged or disposed in a mounting structure comprising a bottom workholding structure and a lid structure as well as a height setting spacer which is used as a stop during a manufacturing or assembling process of the power module,
   wherein each of the first substrate and the second substrate is a direct copper bonding substrate or a direct aluminum bonding substrate; and
   wherein the first substrate and/or the second substrate comprises at least one chip formed in or on the respective substrate.

2. The method according to claim 1, wherein the reducing of the thickness of the compensation layer is performed by pressing the lid structure onto the second substrate.

3. The method according to claim 1, further comprises mounting the first substrate on a bottom plate.

4. The method according to claim 3, further comprising arranging the height setting spacer on the bottom plate.

5. The method according to claim 1, wherein the compensation layer comprises a conductive material.

6. The method according to claim 1, wherein the compensation layer is formed by a material which has a melting point below a given threshold value.

7. The method according to claim 6, wherein the material is solder.

8. The method according to claim 1, wherein the compensation layer is formed by a compressible material.

9. The method according to claim 8, wherein the compressible material is a foam material.

10. The method according to claim 9, wherein the foam material is a conductive foam material.

11. The method according to claim 1, further comprising encapsulating the power module.

12. A method of manufacturing a power module, the method comprising:
    arranging a first substrate on a bottom plate;
    disposing a connecting layer atop of the first substrate;
    disposing a compensation layer of a first thickness above the connecting layer;
    disposing a second substrate above the compensation layer; and
    reducing the first thickness to a second thickness by an abrasive-free process by using a height setting spacer as a stop during a manufacturing or assembling process of the power module,
    wherein the second thickness of the compensation layer is smaller than a thickness of the connecting layer,
    wherein each of the first substrate and the second substrate is a direct copper bonding substrate or a direct aluminum bonding substrate; and wherein the first substrate and/or the second substrate comprises at least one chip formed in or on the respective substrate.

\* \* \* \* \*